(12) United States Patent
Jeong

(10) Patent No.: US 7,746,122 B2
(45) Date of Patent: Jun. 29, 2010

(54) INPUT BUFFER FOR SEMICONDUCTOR MEMORY APPARATUS

(75) Inventor: Hoe Kwon Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 204 days.

(21) Appl. No.: 11/637,081

(22) Filed: Dec. 12, 2006

(65) Prior Publication Data

US 2007/0188200 A1 Aug. 16, 2007

(30) Foreign Application Priority Data

Feb. 10, 2006 (KR) ...................... 10-2006-0012806

(51) Int. Cl.
*H03K 3/00* (2006.01)

(52) U.S. Cl. ........................... 327/108; 327/51; 327/77; 327/89; 327/52; 327/53

(58) Field of Classification Search ................... None
See application file for complete search history.

(56) References Cited

U.S. PATENT DOCUMENTS

| 3,869,624 | A | * | 3/1975 | Fletcher et al. ............. 327/174 |
| 3,896,624 | A | * | 7/1975 | Chang ......................... 405/29 |
| 3,959,713 | A | * | 5/1976 | Davis et al. ................. 323/278 |
| 5,629,702 | A | * | 5/1997 | Koyasu et al. ............... 341/155 |
| 6,031,393 | A | | 2/2000 | Wayner |
| 6,043,685 | A | * | 3/2000 | Lee .............................. 327/52 |
| 6,529,043 | B1 | | 3/2003 | Hannan |
| 6,847,559 | B2 | | 1/2005 | Oh et al. |
| 6,891,763 | B1 | | 5/2005 | Han |
| 6,906,968 | B2 | | 6/2005 | Kim et al. |
| 7,020,031 | B2 | | 3/2006 | Shin et al. |
| 7,274,251 | B2 | * | 9/2007 | Yang ........................... 327/543 |
| 7,292,083 | B1 | * | 11/2007 | Wang et al. .................. 327/205 |
| 7,368,996 | B2 | * | 5/2008 | Tanoue et al. ............... 330/301 |
| 7,504,871 | B2 | * | 3/2009 | Kim et al. .................... 327/218 |
| 2002/0008550 | A1 | * | 1/2002 | Sim et al. ..................... 327/57 |
| 2004/0027862 | A1 | | 2/2004 | Oh et al. |

FOREIGN PATENT DOCUMENTS

| JP | 2004071145 | 3/2004 |
| KR | 101998001146 | 4/1998 |
| KR | 102000002107 | 4/2000 |
| KR | 102001000421 | 1/2001 |

* cited by examiner

*Primary Examiner*—Tuan Lam
*Assistant Examiner*—Hiep Nguyen
(74) *Attorney, Agent, or Firm*—Venable LLP; Jeffri A. Kaminski

(57) ABSTRACT

Disclosed are an input buffer, and more particularly, a technique that is capable of improving the operation speed of the input buffer by improving response speed with respect to an input signal. The input buffer includes a buffer unit that operates when an activation control signal is activated, compares the voltage of an input signal to a preset reference voltage, and outputs the result of the comparison to an output node, a driving unit that performs driving control on an output of the buffer unit, and outputs an output signal, and a pull-down control unit that outputs a pull-down control signal that has a high pulse for a predetermined time when transition of a potential of the input signal occurs.

23 Claims, 4 Drawing Sheets

INPUT BUFFER FOR SEMICONDUCTOR MEMORY APPARATUS

BACKGROUND OF THE INVENTION

1. Technical Field

The present invention relates to an input buffer for a semiconductor memory apparatus. In particular, the present invention relates to a technique that is adapted for an input buffer for a very high speed semiconductor memory apparatus having low power consumption by increasing a response speed with respect to an input signal.

2. Related Art

In general, a semiconductor memory apparatus uses an input buffer so as to receive data, and external signals, such as an address signal, a control signal, and the like. An input buffer circuit converts a voltage at a TTL (Transistor Transistor logic) level that is applied from the outside the semiconductor memory apparatus into a voltage at a CMOS (Complementary Metal Oxide Semiconductor) level on the basis of the environment in chips.

It is well known that the speed at which internal circuits of the semiconductor memory apparatus operate has currently been increased such that a semiconductor memory apparatus enables high frequency operation using low power.

With the technical trend of the semiconductor memory apparatus, the input buffer also has a circuit structure adapted for a low power environment and at the same time, increases the response speed with respect to an input signal. Therefore, the input buffer has contributed to low power consumption and high speed access of the chips.

In general, an input buffer having the above-described characteristics has a structure of a differential amplifier of the type of a current mirror.

FIG. 1 is a circuit diagram illustrating an input buffer according to the related art.

As shown in FIG. 1, an input buffer according to the related art includes a driving control unit 10, a buffer unit 20, and an output driver 30.

The driving control unit 10 includes an inverter IV1 that inverts an input control signal ctrl1 and outputs an inverted control signal ctrl1$b$.

The buffer unit 20 includes a structure that performs differential amplification of an input signal in1 and a reference signal vref1. The buffer unit 20 includes a plurality of PMOS transistors, P1 to P4, and a plurality of NMOS transistors, N1 to N3, that have a current mirror structure. More specifically, the plurality of PMOS transistors P1 to P4 have a common source terminal to which a power supply voltage VDD is applied, the PMOS transistors P1 and P2 have a common drain terminal connected to the NMOS transistor N1, and the PMOS transistors P3 and P4 have a common drain terminal connected to the NMOS transistor N2. Each of the PMOS transistors P1 and P4 has a gate terminal to which the control signal ctrl1$b$, that is, the output of the driving control unit 10, is applied. Each of the PMOS transistors P2 and P3 has a gate terminal connected to the NMOS transistor N2.

In addition, the NMOS transistors N1 and N3 are connected in series between the PMOS transistor P2 and a ground voltage terminal VSS. Here, the NMOS transistor N1 has a gate terminal to which the input signal in1 is applied, and the NMOS transistor N3 has a gate terminal to which the inverted control signal ctrl1$b$ is applied. The NMOS transistor N2 is connected between the PMOS transistor P3 and the NMOS transistor N3, and has a gate terminal to which a reference voltage vref1 is applied.

The output driver 30 includes inverters IV2 and IV3 that are connected in series. The inverter IV2 inverts a signal at a node c1, which is an output of the buffer unit 20, and outputs the inverted signal to a node d1. The inverter IV3 inverts a signal at the node d1 and outputs an output signal out1.

Operation of the input buffer according to the related art that has the above-described structure will be described with reference to FIG. 2, which is an operation timing chart.

Throughout the specification to be described in detail below, it is assumed that the power supply voltage VDD is 1.6 V, a logical high level is correspondingly 1.6 V, and the reference voltage vref1 is approximately 0.8 V.

First, when the input control signal ctrl1 changes to a high level (that is, 1.6 V), the inverted control signal ctrl1$b$ changes to a low level. The NMOS transistor N3 for activating the buffer unit 20 is turned off, and thus the input buffer does not operate.

Then, when the control signal ctrl1 changes to a low level (that is, 0 V), the inverted control signal ctrl1$b$ changes to a high level. The NMOS transistor N3 is turned on, and thus the input buffer operates.

Further, the buffer unit 20 compares the reference voltage vref1 and a voltage of the input signal in1, and outputs a result of the comparison to the node c1. That is, when the power supply voltage VDD is 1.6 V and the ground voltage VSS is 0 V, the reference voltage vref1 becomes 0.8 V, which corresponds to an intermediate level between the power supply voltage VDD and the ground voltage VSS.

Therefore, when the voltage of the input signal in1 is higher than the reference voltage vref1, the current flowing through the NMOS transistor N1 increases, and thus the node c1 changes to a low level. On the other hand, when the voltage of the input signal in1 is lower than the reference voltage vref1, the current flowing through the PMOS transistor P2 and the NMOS transistor N2 increases, and thus the signal at the node c1 changes to a high level.

Then, the output driver 30 amplifies the signal at the output node c1 of the buffer unit 20 into the output signal out1. The inverters IV2 and IV3 non-inversely delay the signal at the node c1, and output the output signal out1.

Referring to FIG. 2, in an input buffer according to the related art, the buffer unit 20 operates at a point of time (A) (that is, 10 ns) when the input signal in1 changes from a high level to a low level, and the signal at the node c1 changes from a low level to a high level (10.8 ns).

However, in the buffer unit 20, since a potential changes according to a change in current, it takes a long time for the signal at the node c1 to change from a low level to a high level. In order to solve this problem, an operation speed of the buffer unit 20 may be improved by increasing the size of the NMOS transistor N3. In this case, however, the current consumed by the buffer unit 20 increases.

As a result, since it takes approximately 1.3 ns for the input signal in1 (10 ns) to be output as the output signal out1 (11.3 ns), there is a limit on improving the operation speed of an input buffer that needs to operate quickly.

SUMMARY OF THE INVENTION

Embodiments of the present invention provide an input buffer that has an increased response speed when responding to an input signal.

Further embodiments of the present invention provide an input buffer that performs pulse control to charge or discharge a voltage at an output node in response to an input signal at a high speed.

According to an embodiment of the present invention, there is provided an input buffer, which may include a buffer unit that operates when an activation control signal is activated, compares the voltage of an input signal and a preset reference voltage, and outputs a result of the comparison to an output node, and a response speed control unit that receives the input signal and an output signal output from the output node, generates a pulse signal according to input conditions of the signals, and performs a control operation to charge or discharge a voltage at the output node.

The response speed control unit may include a pulse generating unit that receives the input signal and the output signal output from the output node, and a pull-down unit that performs a control operation to charge or discharge the voltage at the output node in response to a pulse signal output from the pulse generating unit.

The response speed control unit may activate and output the pulse signal at a point of time when the input signal changes from a high level to a low level.

The pulse generating unit may include a NOR gate.

The pull-down unit may include one NMOS transistor to which the pull-down control signal is applied.

An input buffer according to an embodiment of the invention may further include a driving control unit that inverts an input control signal and outputs the activation control signal.

An input buffer according to an embodiment of the invention may further include an output driver that amplifies an output of the buffer unit and outputs the amplified output.

The buffer unit may include a differential amplifier.

The output driver may include a plurality of inverter elements that non-inversely delay the signal at the output node and output the output signal.

According to another embodiment of the present invention, there is provided an input buffer for a semiconductor memory apparatus, which may include a buffer unit that operates when an activation control signal is activated, compares the voltage of an input signal and a preset reference voltage, and outputs a result of comparison to an output node, an output driver that controls the driving of an output of the buffer unit, and outputs an output signal, and a pull-down control unit that outputs a pull-down control signal that has a high pulse for a predetermined time from a point of time when the transition of a potential of the input signal occurs, and performs pull-down driving on the buffer unit.

A pull-down control unit may activate and output the pull-down control signal when the input signal changes from a high level to a low level.

An input buffer according to an embodiment of the present invention may further include an input unit that inverts an input control signal and outputs an activation control signal.

The buffer unit may include a differential amplifier.

The pull-down control unit may include a logical element that performs a logical operation on the input signal and the output signal, and outputs the pull-down control signal, and a pull-down driving element that performs pull-down driving on the buffer unit for a predetermined time according to the pull-down control signal.

The pull-down control signal may be a pulse signal.

The logical element may include a NOR gate.

The pull-down driving element may include one NMOS transistor to which the pull-down control signal is applied.

The output driver may include a plurality of inverter elements that amplify the signal at the output node and output the output signal.

BRIEF DESCRIPTION OF THE DRAWINGS

The above and other features of the present invention will become more apparent by describing in detail exemplary embodiments thereof with reference to the attached drawings in which.

DESCRIPTION OF EXEMPLARY EMBODIMENTS

Figure 1:
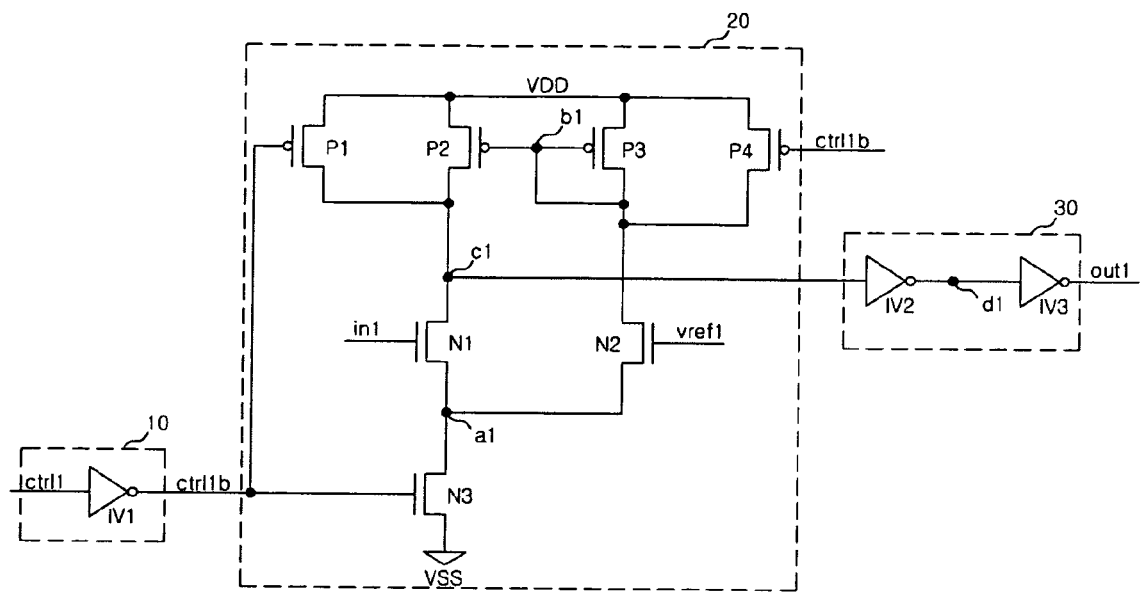
FIG. 1 is a circuit diagram of an input buffer according to the related art.
Figure 2:
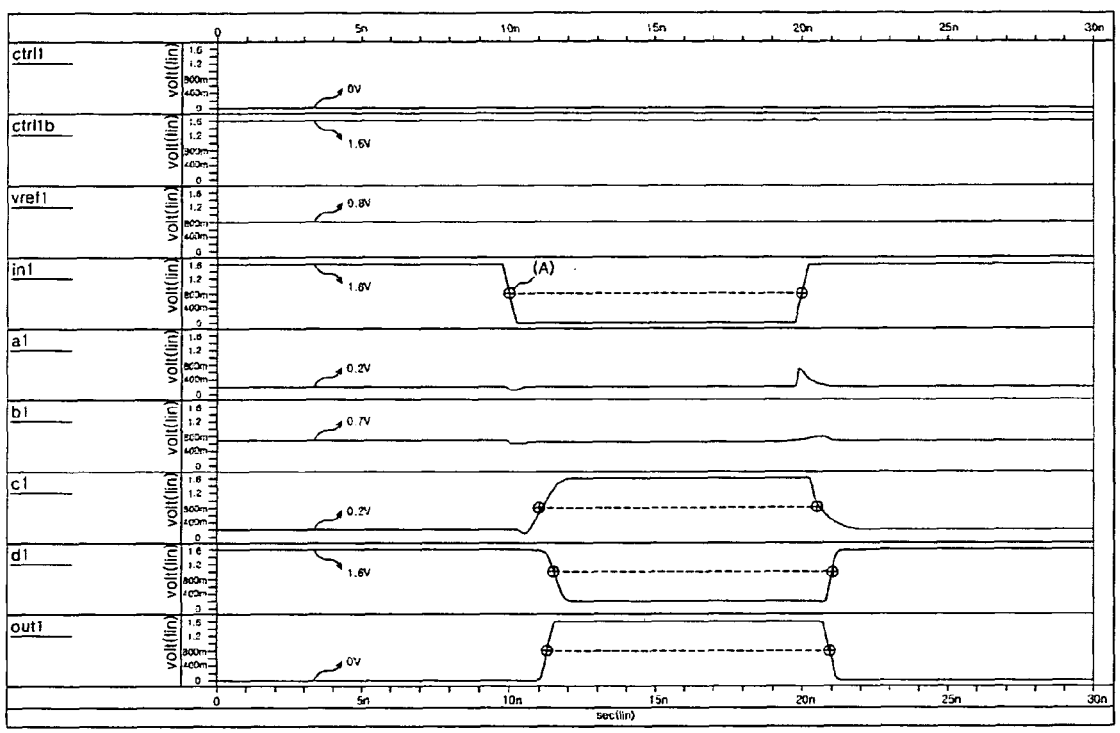
FIG. 2 is a timing chart illustrating the operation of the input buffer of FIG. 1.

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 3:
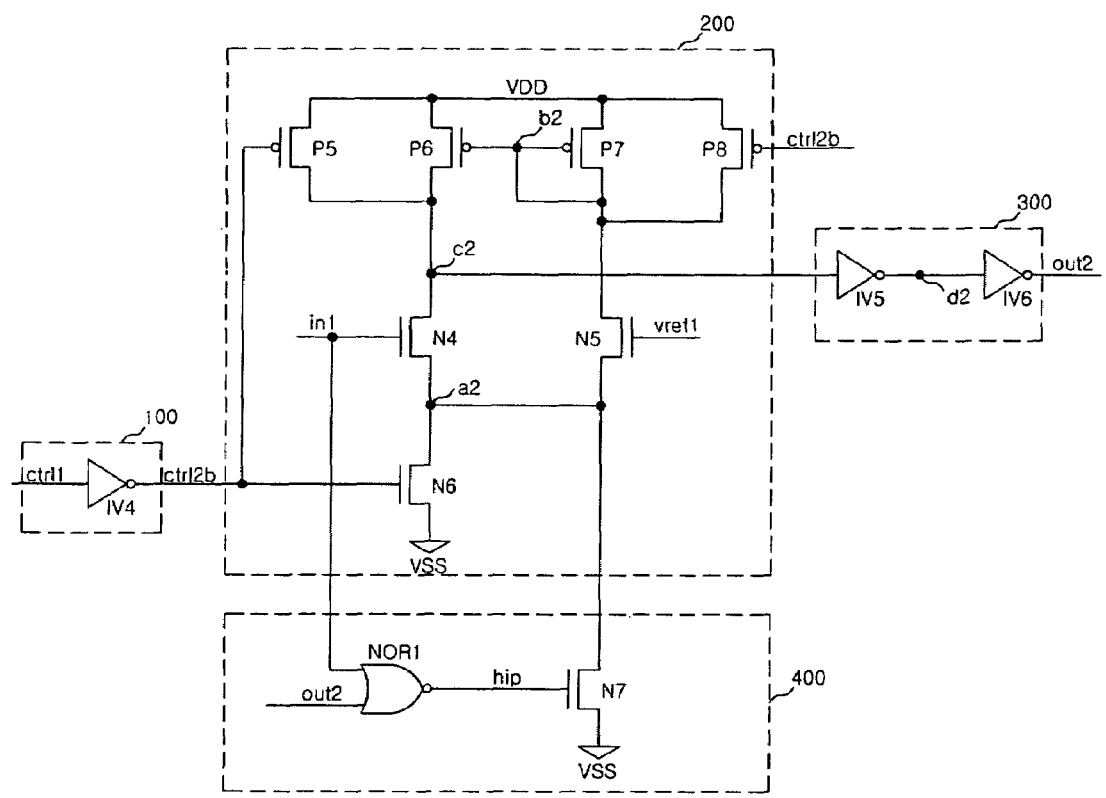
FIG. 3 is a circuit diagram of an input buffer according to an embodiment of the present invention.

Referring to FIG. 3, an input buffer according to an embodiment of the present invention includes a driving control unit 100, a buffer unit 200, an output driver 300, and a pull-down control unit 400 that is a response speed control unit.

In the structure of FIG. 3, the buffer unit 200 operates when an activation control signal ctrl2b is activated, compares an input signal in1 and a preset reference signal vref1, and outputs a result of this comparison to an output node c2. Further, the pull-down control unit 400, which is the response speed control unit, receives the input signal in1 and an output signal out2 of the output driver 300, generates a pulse signal hip according to the input conditions of the signals (i.e., the input signal in1 and the signal of the output node C2), and performs a control operation such that a voltage at the output node c2 is charged or discharged.

Here, the driving control unit 100 includes an inverter IV4 that inverts an input control signal ctrl1 and outputs the activation control signal ctrl2b.

The buffer unit 200 has the structure of a differential amplifier. The buffer unit 200 includes a plurality of PMOS transistors P5 to P8 and a plurality of NMOS transistors N4 to N6 that have a current mirror structure.

The plurality of PMOS transistors P5 to P8 have a common source terminal to which a power supply voltage VDD is applied, the PMOS transistors P5 and P6 have a common drain terminal connected to the NMOS transistor N4, and the PMOS transistors P7 and P8 have a common drain terminal connected to the NMOS transistor N5. Each of the PMOS transistors P5 and P8 has a gate terminal to which the activation control signal ctrl2b, which is an output of the driving control unit 100, is applied. Each of the PMOS transistors P6 and P7 has a gate terminal connected to the NMOS transistor N5.

In addition, the NMOS transistors N4 and N6 are connected in series between the PMOS transistor P6 and a ground voltage terminal. The NMOS transistor N4 has a gate terminal to which the input signal in1 is applied, and the NMOS transistor N6 has a gate terminal to which the activation control signal ctrl2b is applied. Further, the NMOS transistor N5 is connected between the PMOS transistor P7 and the NMOS transistor N6, and has a gate terminal to which a reference voltage vref1 is applied.

The output driver 300 has an inverter IV5 and an inverter IV6. The inverter IV5 inverts a signal at the output node c2 of the buffer unit 200 and outputs the inverted signal to a node d2. The inverter IV6 inverts a signal at the node d2 and outputs the output signal out2.

The pull-down control unit 400, which is the response speed control unit, includes an NOR gate NOR1 and an NMOS transistor N7. Here, the NOR gate NOR1, which is a pulse generating unit, receives the input signal in1 and the output signal out2, which is generated and output from the output node c2. The NMOS transistor N7, which is a pull-down unit, responds to the pulse signal hip output from the NOR gate NOR1, which is the pulse generating unit, and performs a control operation to charge or discharge the voltage at the output node c2.

The pull-down control unit 400 may activate and output the pulse signal hip at a point of time when the input signal in1 changes from a high level to a low level.

Also, the pulse generating unit may be composed of a circuit having an NOR gate.

The pull-down unit may include one NMOS transistor to which a pull-down control signal, which is the pulse signal, is applied.

The NOR gate NOR1 performs a NOR operation on the input signal in1 and the output signal out2 and outputs the pull-down control signal hip. The NMOS transistor N7 is connected between the NMOS transistor N5 and the ground voltage terminal. Further, the NMOS transistor N7 has a gate terminal to which the pull-down control signal hip is applied.

Figure 4:
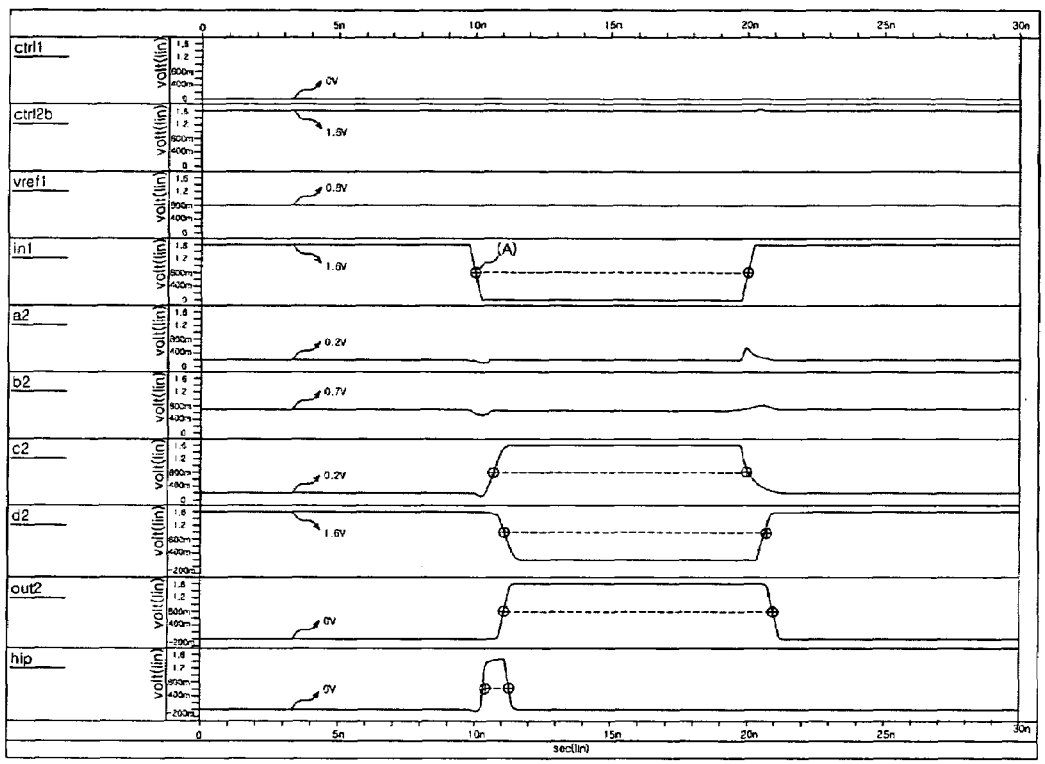
FIG. 4 is a timing chart illustrating the operation of the input buffer of FIG. 3.

Operation of the embodiment of the present invention that has the above-described structure will be described with reference to the operation timing chart of FIG. 4.

First, when the input control signal ctrl1 changes to a high level (that is, 1.6V), the inverted control signal ctrl2b changes to a low level. Therefore, the NMOS transistor N6 that activates the buffer unit 200 is turned off, and thus the input buffer does not operate.

Thereafter, when the control signal ctrl1 changes to a low level (that is, 0 V), the inverted control signal ctrl2b changes to a high level. Therefore, the NMOS transistor N6 is turned on, and thus the input buffer operates.

Then, the buffer unit 200 compares the reference voltage vref1 and a voltage of the input signal in1, and outputs a result of the comparison to the node c2. That is, when the power supply voltage VDD is 1.6 V and the ground voltage VSS is 0 V, the reference voltage vref1 becomes 0.8 V, which corresponds to an intermediate level between the power supply voltage VDD and the ground voltage VSS.

Therefore, when the voltage of the input signal in1 is higher than the reference voltage vref1, the current flowing through the NMOS transistor N4 is increased, and thus the signal at the node c2 changes to a low level. In contrast, when the voltage of the input signal in1 is lower than the reference voltage vref1, the current flowing through the PMOS transistor P6 and the NMOS transistor N5 is increased, and the signal at the node c2 changes to a high level.

The NOR gate NOR1 performs an NOR operation on the input signal in1 and the output signal out2. Therefore, the NOR gate only activates the pull-down control signal hip, which has a high pulse, for the time period when the input signal in1 changes from a high level to a low level.

Further, a drain of the NMOS transistor N7 is connected to a node a2 (that is, a drain of the MOS transistor N6). Here, the gate of the MOS transistor receives the pull-down control signal hip, which is an output of the NOR gate NOR1. The NMOS transistor N7 is a ground voltage driving element that operates during the interval in which the pull-down control signal hip has a high pulse. The high pulse width of the pull-down control signal hip may be 758 pS (pico seconds).

That is, when the input signal in1 changes from a high to a low level, the signal at the node c2 changes from a low level to a high level. At this time, the pull-down control signal hip, which has a high pulse width generated for the time period in which the input signal in1 is changing from a high level to a low level, is activated, thereby momentarily lowering the potential at the node a2 and the potential at the node b2.

According to an embodiment of the present invention, the driving capability of the input buffer may be improved during the momentary high-pulse interval of the pull-down control signal hip without increasing the static current. Therefore, a rising slope at the node c2 is improved, such that a rising time of 10.9 ns for the output signal out2 may be 0.4 ns shorter than the previous rising time of 11.3 ns.

Next, the output driver 300 performs a driving operation such that loss of the potential does not occur when transmitting the signal at the node c2, which is output from the buffer unit 200, to the output signal out2. The inverters IV5 and IV6 amplify the signal at node c2 and output the output signal out2.

As described above, in order to improve the response speed of the input buffer with respect to the input signal, an embodiment of the present invention may improve the operation speed of the input buffer by improving the rising slope at the output node of the buffer unit by using the pull-down control signal that only operates during the high pulse interval.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. An input buffer comprising:
    a buffer unit configured to operate when an activation control signal is activated, compare a voltage of an input signal to a preset reference voltage, and output a result of the comparison to an output node; and
    a response speed control unit coupled to the buffer unit and configured to receive the input signal and the output from the output node, generate a pulse signal according to input conditions of the input signal and the output from the output node, and perform a control operation to change a logic level of a voltage at the output node in response to the pulse signal, wherein the response speed control unit includes a pulse generating unit for the pulse signal, and
    the pulse generating unit includes a NOR gate receiving the input signal and the output from the output node and configured to output the pulse signal.

2. The input buffer of claim 1,
    wherein the response speed control unit includes: and
    a pull-down unit coupled to the pulse generating unit and configured to perform a control operation to charge or discharge the voltage at the output node in response to the pulse signal,
    wherein the pull-down unit is configured to perform the discharging operation when the pulse signal is a high level.

3. The input buffer of claim 1,
    wherein the response speed control unit is configured to activate and output the pulse signal when the input signal changes from a high level to a low level and the output from the output node is at a low level.

4. The input buffer of claim 1,
wherein the response speed control unit is configured to activate and output the pulse signal when the input signal changes from a high level to a low level and the output from the output node changes from a high level to a low level.

5. The input buffer of claim 2,
wherein the pull-down unit includes an NMOS transistor to which the pulse signal is applied.

6. The input buffer of claim 1, further comprising:
a driving control unit configured to invert an input control signal and output the activation control signal.

7. The input buffer of claim 1, further comprising:
an output driver configured to amplify the output of the buffer unit and output the amplified output.

8. The input buffer of claim 7,
wherein the output driver includes a plurality of inverter elements configured to non-inversely delay the output signal at the output node and output an output signal.

9. The input buffer of claim 1,
wherein the buffer unit includes a differential amplifier.

10. An input buffer, the input buffer comprising:
a buffer unit configured to operate when an activation control signal is activated, compare the voltage of an input signal to a preset reference voltage, and output a result of the comparison as an output to an output node, wherein the buffer unit includes: first and second PMOS transistor configured to receive the activation control signal, and first and second NMOS transistor configured to receive the input signal and the preset reference voltage, respectively; and a third NMOS transistor configured to supply a ground voltage to the first and second NMOS transistors when the activation control signal is activated, and activate the buffer unit; and wherein the buffer unit further includes third and fourth PMOS transistor coupled in parallel to the first and second PMOS transistors, respectively, and configured to selectively supply a power supply voltage to the first and second NMOS transistors according to the activation control signal
an output driver coupled to the buffer unit and configured to control the driving of the output of the buffer unit, and output an output signal; and
a pull-down control unit coupled to the buffer unit and configured to receive the input signal and the output signal of the output driver, output a pull-down control signal having a high pulse for a predetermined time when a change in potential of the input signal occurs, and perform pull-down driving on the buffer unit in response to an enabling of the pull-down control signal.

11. The input buffer of claim 10,
wherein the pull-down control unit is configured to activate and output the pull-down control signal when the input signal changes from a high level to a low level and the output from the output node is at a low level.

12. The input buffer of claim 10, further comprising:
a driving control unit configured to invert an input control signal and output the activation control signal.

13. The input buffer of claim 10,
wherein the pull-down control unit includes:
a logical element configured to perform a logical operation on the input signal and the output signal of the output driver, and output the pull-down control signal; and
a pull-down driving element coupled to the logical element and configured to perform pull-down driving of the buffer unit for a predetermined time period according to the pull-down control signal,
wherein the pull-down driving element is configured to perform the pull-down driving when the pull-down control signal is at a high level.

14. The input buffer of claim 13,
wherein the logical element includes a NOR gate.

15. The input buffer of claim 13,
wherein the pull-down driving element includes a fourth NMOS transistor that is coupled between the first and second NMOS transistors and a ground voltage terminal, and has a gate terminal configured to receive the pull-down control signal.

16. The input buffer of claim 14,
wherein the pull-down driving element includes a fourth NMOS transistor that is coupled between the first and second NMOS transistors and a ground voltage terminal, and has a gate terminal configured to receive the pull-down control signal.

17. The input buffer of claim 10,
wherein the output driver includes a plurality of inverter elements configured to amplify the output at the output node and output the amplified signal as the output signal.

18. An input buffer, the input buffer comprising:
a driving control unit configured to output an activation control signal;
a buffer unit coupled to a the driving control unit and configured to compare a voltage of an input signal to a preset reference voltage in response to an activation control signal, and output a result of the comparison as an output signal to an output node; and
a response speed control unit coupled to a buffer unit and configured to include a pulse generating unit configured to receive the input signal and the output signal output from the output node and to generate a pulse signal, wherein the pulse generating unit includes a NOR gate, and a pull-down unit coupled to the pulse generating unit and configured to perform a control operation to change a logic level of a voltage at the output node in response to receiving the pulse signal output by the pulse generating unit, wherein the response speed control unit is configured to activate and output a pulse signal when the input signal changes from a high level to a low level while the output from the output node is a low level or the output from the output node changes from a high level to a low level.

19. The input buffer of claim 18,
wherein the pull-down unit includes an NMOS transistor configured to receive the pull-down control.

20. The input buffer of claim 18,
wherein the driving control unit includes an inverter is configured to inverts an input control signal and output the activation control signal.

21. The input buffer of claim 18, further comprising:
an output driver coupled to the buffer unit and configured to amplify the output signal of the buffer unit and output the amplified output.

22. The input buffer of claim 21,
wherein the output driver includes a plurality of inverter elements configured to non-inversely delay the signal at the output node and output the output signal.

23. The input buffer of claim 18,
wherein the buffer unit includes a differential amplifier.

* * * * *